(12) United States Patent
Brandorff

(10) Patent No.: US 9,851,378 B2
(45) Date of Patent: Dec. 26, 2017

(54) METHODS OF FABRICATING PROBE CARDS INCLUDING NANOTUBES

(75) Inventor: Alexander Brandorff, New Milford, CT (US)

(73) Assignee: Wentworth Laboratories Inc., Brookfield, CT (US)

( * ) Notice: Subject to any disclaimer, the term of this patent is extended or adjusted under 35 U.S.C. 154(b) by 22 days.

(21) Appl. No.: 13/120,540

(22) PCT Filed: Sep. 29, 2009

(86) PCT No.: PCT/US2009/058787
§ 371 (c)(1),
(2), (4) Date: Feb. 23, 2012

(87) PCT Pub. No.: WO2010/037097
PCT Pub. Date: Apr. 1, 2010

(65) Prior Publication Data
US 2012/0199280 A1    Aug. 9, 2012

Related U.S. Application Data

(60) Provisional application No. 61/100,962, filed on Sep. 29, 2008.

(51) Int. Cl.
*B05D 5/12* (2006.01)
*G01R 1/067* (2006.01)
(Continued)

(52) U.S. Cl.
CPC .......... *G01R 1/06755* (2013.01); *B82Y 30/00* (2013.01); *B82Y 40/00* (2013.01);
(Continued)

(58) Field of Classification Search
USPC ............. 427/122, 98.5, 99.1, 249.1; 977/847
See application file for complete search history.

(56) References Cited

U.S. PATENT DOCUMENTS 3,582,330 A * 6/1971 Kocsis .................... H01L 21/00
                                                148/DIG. 102
5,546,405 A * 8/1996 Golla ............................ 714/724
(Continued)

FOREIGN PATENT DOCUMENTS

CN          1489695           4/2004
DE     102007050843 A1        5/2008
(Continued)

OTHER PUBLICATIONS

Xu, T., et al., "Aligned carbon nanotubes for through-wafer interconnects," Applied Physics Letters 91, American Institute of Physics, 2007.
(Continued)

*Primary Examiner* — Brian K Talbot
(74) *Attorney, Agent, or Firm* — Wiggin and Dana LLP; Gregory S. Rosenblatt; Andrew D. Bochner

(57) ABSTRACT

Methods of fabricating a plurality of carbon nanotube-bundle probes on a substrate are disclosed. In some embodiments, the method includes the following: providing a substrate having a top surface and a bottom surface; forming an array of electrically conductive pads on the top surface, the array of electrically conductive pads being formed to mirror an array of pads on an integrated circuit that is to be tested; applying a catalyst for promoting growth of carbon nanotubes on each of the array of electrically conductive pads; heating the substrate in a carbon-rich environment thereby growing nanotubes extending upwardly from each of the array of electrically conductive pads and above the top surface of the substrate thereby forming a plurality of carbon nanotube-bundle probes extending upwardly above the top surface of the substrate; and capping each of the plurality of carbon nanotube-bundle probes with an electrically conductive material.

4 Claims, 9 Drawing Sheets

(51) Int. Cl.
  *B82Y 30/00* (2011.01)
  *B82Y 40/00* (2011.01)
  *C01B 31/02* (2006.01)
  *C23C 16/26* (2006.01)
  *G01R 3/00* (2006.01)

(52) U.S. Cl.
  CPC ............ *C01B 31/0226* (2013.01); *B05D 5/12* (2013.01); *C23C 16/26* (2013.01); *G01R 3/00* (2013.01)

(56) References Cited

U.S. PATENT DOCUMENTS

| | | | |
|---|---|---|---|
| 6,849,554 B2 | 2/2005 | Rattner et al. | |
| 6,906,539 B2* | 6/2005 | Wilson et al. | 324/756.03 |
| 7,235,989 B2* | 6/2007 | Li et al. | 324/756.04 |
| 7,439,731 B2* | 10/2008 | Crafts et al. | 324/756.03 |
| 7,489,141 B1* | 2/2009 | Vermeire | G01D 5/24 324/646 |
| 7,766,662 B2* | 8/2010 | Akama et al. | 439/63 |
| 2002/0109514 A1 | 8/2002 | Brandorff et al. | |
| 2003/0211029 A1 | 11/2003 | Someya et al. | |
| 2004/0106218 A1* | 6/2004 | Wang et al. | 438/15 |
| 2004/0211589 A1* | 10/2004 | Chou et al. | 174/253 |
| 2008/0171316 A1* | 7/2008 | Golovchenko | C12Q 1/6869 435/6.11 |
| 2009/0002004 A1 | 1/2009 | Wang et al. | |
| 2009/0002009 A1 | 1/2009 | Brandorff | |
| 2009/0066352 A1 | 3/2009 | Gritters et al. | |
| 2009/0121732 A1 | 5/2009 | Crafts et al. | |
| 2009/0197484 A1 | 8/2009 | Chen et al. | |
| 2010/0083489 A1 | 4/2010 | Eldridge et al. | |
| 2010/0112828 A1 | 5/2010 | Eldridge et al. | |

FOREIGN PATENT DOCUMENTS

| | | |
|---|---|---|
| JP | 10260233 | 9/1998 |
| JP | 2006226702 | 8/2006 |
| JP | 2006273601 | 10/2006 |
| JP | 2008201594 | 9/2008 |
| KR | 10-2009-0050092 | 5/2009 |
| TW | 1220163 | 11/2004 |
| WO | 2008069485 A1 | 6/2008 |
| WO | 2010037097 A1 | 4/2010 |

OTHER PUBLICATIONS

Maschmann, M., et al., "Optimization of carbon nanotube synthesis from porous anodic Al—Fe—Al templates," Birck Nanotechnology Center, Birck and NCN Publications, 2007.

International Search Report and the Written Opinion of the International Searching Authority, International Application PCT/US2009/058787, filed Sep. 29, 2009.

Supplementary European Search Report, European Patent Office, International Application No. PCT/US2009/058787, dated Jul. 23, 2012.

Notification of the First Office Action in Chinese Patent Application No. 201180065274.3. The State Intellectual Property Office, dated Oct. 20, 2014.

Japanese Patent Office, "Notice of Reasons for Refusal," dated Oct. 26, 2015.

Korean Patent Office, "Notice to File a Response," dated Aug. 25, 2015.

European Search Report and Opinion in related application 11847860.1, dated Sep. 26, 2017, 9 pages.

* cited by examiner

METHODS OF FABRICATING PROBE CARDS INCLUDING NANOTUBES

BACKGROUND

1. Field

The disclosed subject matter relates to probe cards for testing the performance of integrated circuits and more particularly to probe cards including nanotube probes and methods of manufacturing probe cards including nanotube probes.

2. Description of the Related Art

In the computer chip manufacturing industry, it is necessary to test the performance of integrated circuits (IC's) at various points in the manufacturing process, in order to weed out defective components and to monitor the manufacturing process. Various technologies have been employed for this purpose, though all are challenged due to the increasing demands of the IC manufacturing process.

In order to electrically test the circuitry, it is necessary to make contact with pads on the IC, i.e. to "probe" the IC. The probes must be able to align very accurately with the IC pads to be tested, and to provide sufficient current to power the IC as well as provide reliable, low resistance electrical contact at low inductance such that the test signals are not distorted. As IC manufacturing progresses to increasingly smaller geometries, increasing number of transistors, and higher clock frequencies, it challenges the abilities of existing technologies to probe the IC. The smaller geometries result in reduced test pad dimensions, which then require the probes to be better aligned to insure that they do not miss the pads. The increasing number of transistors and higher clock frequencies require that the probes be able to provide an increasing amount of current without burning up or "fusing" the probe, or reducing the probes physical characteristics such as spring force and fatigue life.

IC manufacturers increasingly desire that the IC's be tested at elevated ambient temperature to better simulate worst-case environmental conditions or to perform accelerated life testing. This places an increasing burden on the probe to be able to provide the high current levels at elevated temperatures of 150 degrees Celsius. The increased processing speed of the IC's further requires that the probes have low inductance so as not to distort the clock and signal waveforms that are fed to the IC, and to accurately transfer the waveforms from the IC to the monitoring test equipment.

SUMMARY

One aspect of the disclosed subject matter is a method of fabricating a plurality of carbon nanotube-bundle probes on a substrate. In some embodiments, the method includes the following: providing a substrate having a top surface and a bottom surface; forming an array of electrically conductive pads on the top surface, the array of electrically conductive pads being formed to mirror an array of pads on an integrated circuit that is to be tested; applying a catalyst for promoting growth of carbon nanotubes on each of the array of electrically conductive pads; heating the substrate in a carbon-rich environment thereby growing nanotubes extending upwardly from each of the array of electrically conductive pads and above the top surface of the substrate thereby forming a plurality of carbon nanotube-bundle probes extending upwardly above the top surface of the substrate; and capping each of the plurality of carbon nanotube-bundle probes with an electrically conductive material.

Another aspect of the disclosed subject matter is a method of fabricating a plurality of carbon nanotube-bundle probes on a substrate. In some embodiments, the method includes the following: providing a substrate having a top surface, a bottom surface, and an array of micro-holes drilled through and connecting the top and bottom surfaces; providing a metal foil having top and bottom surfaces, the metal foil being configured for joining with the bottom surface of the substrate; applying a catalyst for promoting growth of carbon nanotubes; joining the top surface of the metal foil to the bottom surface of the substrate; heating the metal foil and the substrate in a carbon-rich environment thereby causing each of the array of micro-holes in the substrate to expand thereby forming an array of expanded micro-holes in the substrate; growing nanotubes extending upwardly from the top surface of the metal foil through each of the array of expanded micro-holes in the substrate and above the top surface of the substrate thereby forming a plurality of carbon nanotube-bundle probes extending upwardly above the top surface of the substrate, each of the plurality of carbon nanotube-bundle probes substantially filling a respective one of the array of expanded micro-holes; cooling the metal foil and the substrate thereby causing each of the array of expanded micro-holes in the substrate to contract thereby forming an array of contracted micro-holes in the substrate, each one of the array of contracted micro-holes providing a shrink fit around a respective one of the plurality of carbon nanotube-bundle probes contained therein so as to substantially secure the respective one of the plurality of carbon nanotube-bundle probes contained therein to the substrate; removing the metal foil from the bottom surface of the substrate; and plating or solder bumping each of the plurality of carbon nanotube-bundle probes adjacent the bottom surface of the substrate.

Another aspect of the disclosed subject matter is a method of fabricating a plurality of carbon nanotube-bundle probes extending from opposing surfaces of a substrate. In some embodiments, the method includes the following: providing a substrate having a top surface, a bottom surface, and an array of micro-holes drilled through and connecting the top and bottom surfaces; providing a first metal foil having top and bottom surfaces and an array of holes drilled through and connecting the top and bottom surfaces, the array of holes being arranged to align with the array of micro-holes in the substrate; providing a second metal foil having top and bottom surfaces, the metal foil being configured for joining with the bottom surface of the first metal foil; applying a catalyst for promoting growth of carbon nanotubes; joining the top surface of the first metal foil to the bottom surface of the substrate so that the array of holes is substantially aligned with the array of micro-holes in the substrate; joining the top surface of the second metal foil to the bottom surface of the first metal foil; heating the second metal foil and the substrate in a carbon-rich environment thereby causing each of the array of micro-holes in the substrate to expand thereby forming an array of expanded micro-holes in the substrate; growing nanotubes extending upwardly from the top surface of the second metal foil through each of the array of holes in the first metal foil and the array of expanded micro-holes in the substrate and above the top surface of the substrate thereby forming a plurality of carbon nanotube-bundle probes extending upwardly above the top surface of the substrate, each of the plurality of carbon nanotube-bundle probes substantially filling a respective one of the array of expanded micro-holes; cooling the second metal foil and the substrate thereby causing each of the array of expanded micro-holes in the substrate to contract thereby forming an array of contracted micro-holes in the substrate, each one of the array of contracted micro-holes providing a shrink fit around a respective one of the plurality of carbon nanotube-bundle probes contained therein so as to substantially secure the respective one of the plurality of carbon nanotube-bundle probes contained therein to the substrate; and removing the first and second metal foils from the bottom surface of the substrate.

BRIEF DESCRIPTION OF THE DRAWINGS

For the purpose of illustrating the invention, the drawings show a form of the disclosed subject matter that is presently preferred. However, it should be understood that the disclosed subject matter is not limited to the precise arrangements and instrumentalities shown in the drawings, wherein.

DETAILED DESCRIPTION

The disclosed subject matter includes probe cards and methods of fabricating probe cards that include arrays of carbon nanotubes being used as probes to bridge the gap between a substrate and the IC under test.

Figure 1:
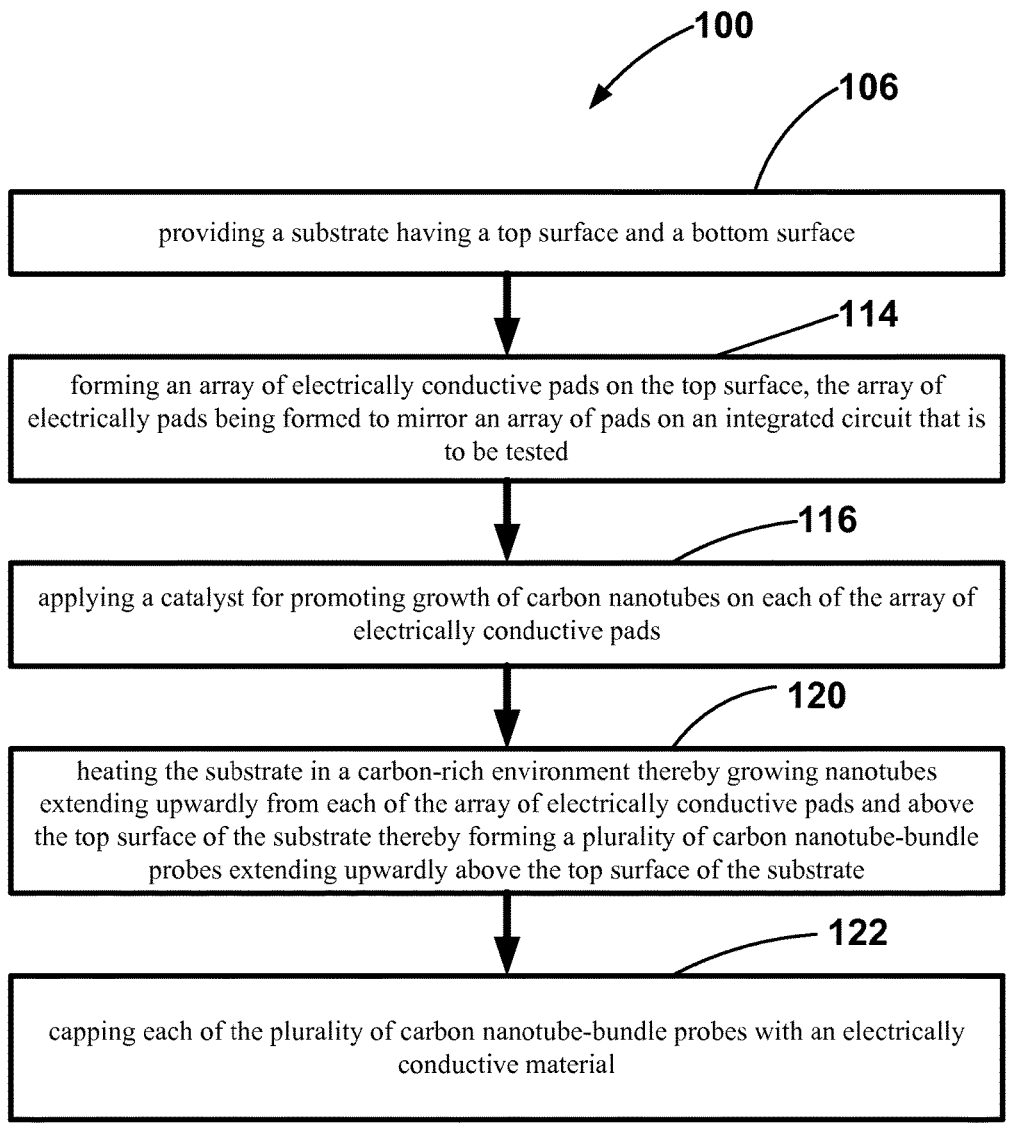
FIG. 1 is a diagram of a method of fabricating a probe card including nanotube probes according to some embodiments of the disclosed subject matter.
Figure 2:
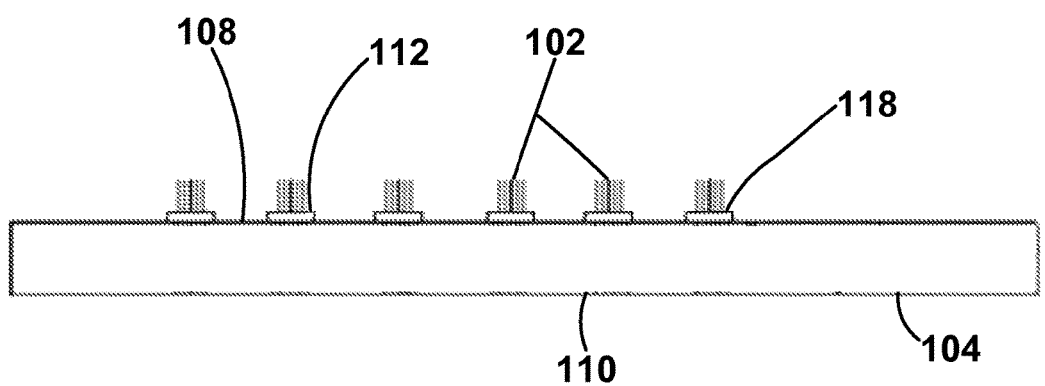
FIG. 2 is a side elevation view of a probe card including nanotube probes according to some embodiments of the disclosed subject matter.

Referring now to FIGS. 1 and 2, some embodiments of the disclosed subject matter include a method 100 of fabricating a plurality of carbon nanotube-bundle probes 102 on a substrate 104. At 106, method 100 includes first providing substrate 104 having a top surface 108 and a bottom surface 110. Substrate 104 can be a patterned silicon wafer, a multi-layer ceramic, glass, or other similar device. Substrate 104 can also contain traces that route from electrically conductive pads 112, which are discussed further below, to connection points, spaced further apart, which serve as an interface to electrical test equipment. The traces can be buried inside the multi-layer substrate 104 so as not to be exposed to the nanotube processing environment, and to provide additional room on the substrate to facilitate the routing of the signals for high density applications.

Next, at 114, an array of electrically conductive pads 112 is formed on top surface 108 of substrate 104. The array of electrically conductive pads 112 is formed to mirror an array of pads on an integrated circuit (not shown) that is to be tested. Pads 112 are typically formed photo-lithographically on substrate 104, which allows for tight pad spacing.

Then, at 116, a catalyst 118, such as gold, iron, etc., for promoting growth of carbon nanotubes is applied to each of the array of electrically conductive pads 112. Catalyst 118 induces the growth of carbon nanotubes at the pad locations.

Next, at 120, substrate 104 is heated in a carbon-rich environment thereby growing nanotubes extending upwardly from each of the array of electrically conductive pads 112 and above top surface 108 of the substrate thereby forming a plurality of carbon nanotube-bundle probes 102 extending upwardly above the top surface of the substrate. Substrate 104 is processed in a way that induces the nanotube formation and growth.

Several methods are known that will induce the growth of nanotubes, such as Chemical vapor Deposition (CVD), Plasma Enhanced Chemical Vapor Deposition (PECVD), Laser Ablation, Arc discharge, etc. In some embodiments, method 100 for inducing nanotube formation and growth is CVD or PECVD, as both provide a controlled process whereby the overall length of the nanotubes can be controlled by controlling the processing time. The substrate is typically heated to temperatures around 700 degrees Celsius in a furnace with a carbon-rich environment such as propane, acetylene, ferrocene, xylene, methane, etc, and possibly in the presence of hydrogen, argon and/or oxygen. Under these conditions, the array of carbon nanotubes would "grow" from the pad surface and fill the entire area of the exposed pads, extending perpendicularly from the pad surface to create a "forest" of aligned nanotubes. The array would be attached to the pad at its base, and each "probe" would then consist of an array of thousands of aligned nanotubes. The array would consist of a variety of nanotube types, some metallic and some semiconducting. However, there would be more than enough of the metallic type to serve as electrical contacts to bridge the space between the substrate and IC under test.

Referring again to FIG. 1, at 122, each of plurality of carbon nanotube-bundle probes 102 is capped with an electrically conductive material such as gold, palladium, etc.

Figure 3:
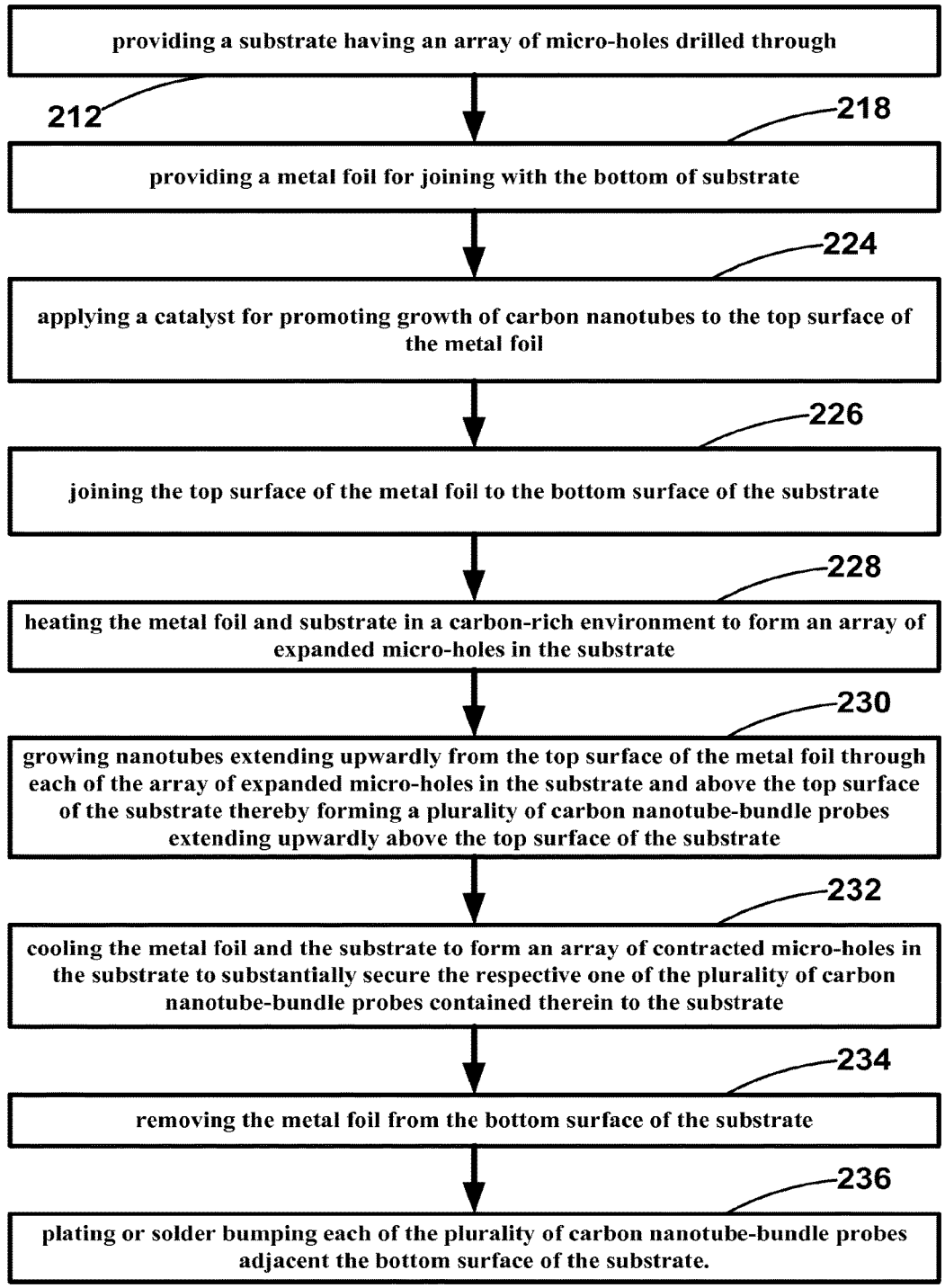
FIG. 3 is a diagram of a method of fabricating a probe card including nanotube probes according to some embodiments of the disclosed subject matter.
Figure 4A:
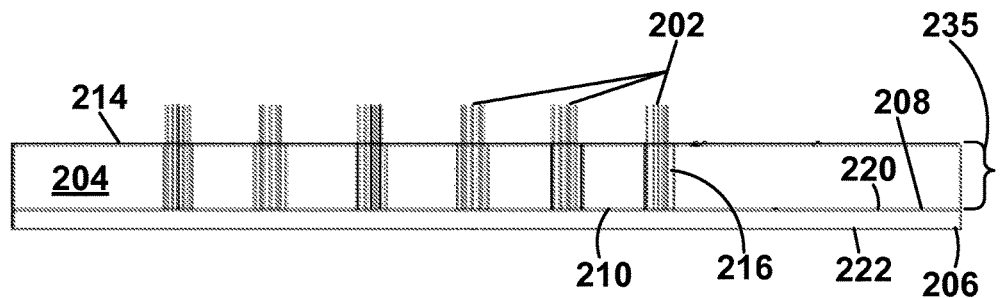
FIGS. 4A and 4B are side elevation views of an assembly including probe cards having nanotube probes according to some embodiments of the disclosed subject matter.
Figure 4B:
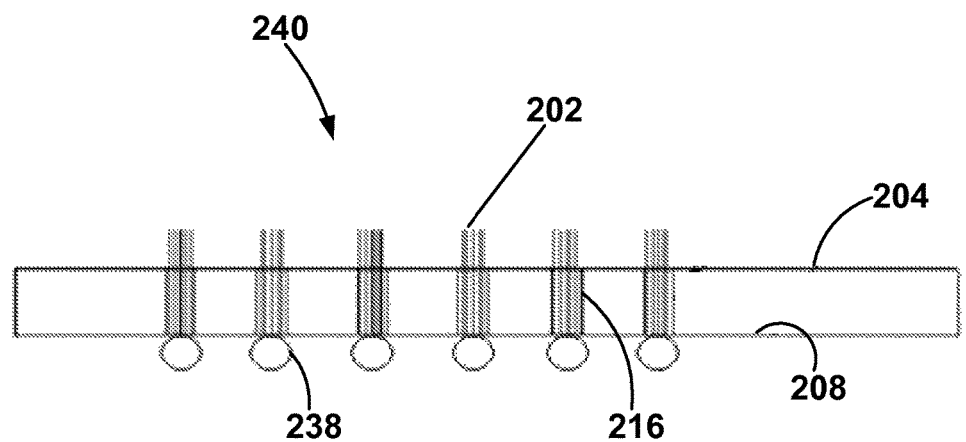

Alternatively, the probe array can be "grown" on a high temperature-capable substrate, and then transferred to a less expensive substrate, such as a printed circuit board. This would allow for a less expensive probe card for applications where elevated temperature testing was not required. Referring now to FIGS. 3, 4A, and 4B, some embodiments of the disclosed subject matter include a method 200 of fabricating a plurality of carbon nanotube-bundle probes 202 on a substrate 204 using a metal foil 206 coated with an appropriate catalyst 208 that is bonded to the underside 210 of the substrate. At 212, method 200 includes first providing substrate 204 having a top surface 214, bottom surface 210, and an array of micro-holes 216 drilled through and connecting the top and bottom surfaces. Substrate 204 is typically prepared by pre-drilling, either mechanically or with a laser, a pattern of micro-holes in a thin substrate, such as ceramic. The hole locations generally correspond to the desired probe locations and the hole diameter to the desired probe bundle diameter.

Next, at 218, metal foil 206 having top and bottom surfaces 220 and 222, respectively, is provided. Metal foil 206 is configured for joining with the bottom surface 222 of substrate 204. Then, at 224, catalyst 208, such as gold, iron, etc., for promoting growth of carbon nanotubes is applied to top surface 220 of metal foil 206. At 226, top surface 220 of metal foil 206 is joined to bottom surface 210 of substrate 204.

At 228, metal foil 206 and substrate 204 are heated in a carbon-rich environment thereby causing each of the micro-holes in the substrate to expand due to thermal expansion thereby forming array of expanded micro-holes 216 in the substrate. At 230, nanotubes are grown so as to extend upwardly from top surface 220 of metal foil 206 through each of array of expanded micro-holes 216 in substrate 204 and above top surface 214 of the substrate thereby forming plurality of carbon nanotube-bundle probes 202 extending upwardly above the top surface of the substrate. Each of plurality of carbon nanotube-bundle probes 202 substantially fills a respective one of array of expanded micro-holes 216. Typically, substrate 204 and foil 206 are placed in a CVD chamber and processed so as to induce nanotube growth. The CVD reaction occurs at temperatures that are typically greater than 700 degrees Celsius. The CVD reaction gasses enter the micro-holes and induce nanotube growth at the hole locations. As mentioned above, the nanotubes pass through the thickness of the substrate and extend several mils past the front substrate surface.

At 232, metal foil 206 and substrate 204 are cooled thereby causing each of array of expanded micro-holes 216 in the substrate to contract thereby forming array of contracted micro-holes in the substrate 216. Each one of array of contracted micro-holes 216 provides a shrink fit around a respective one of plurality of carbon nanotube-bundle probes 202 contained therein so as to substantially secure the respective one of the plurality of carbon nanotube-bundle probes contained therein to substrate 204. At 234, metal foil 206 is removed from bottom surface 210 of substrate 204. Typically, metal foil 206 is removed using etching processes to form an assembly 235 (excluding foil 206). Referring now to FIGS. 3 and 4B, at 236, each of plurality of carbon nanotube-bundle probes 202 is plated or provided with solder bumps 238 adjacent bottom surface 210 of substrate 204 to form an assembly 240.

The substrate/probe assembly can then be aligned with a space transformer having a corresponding set of contact pads and electrically connected to the pads to complete the probe card assembly.

Figure 5A:
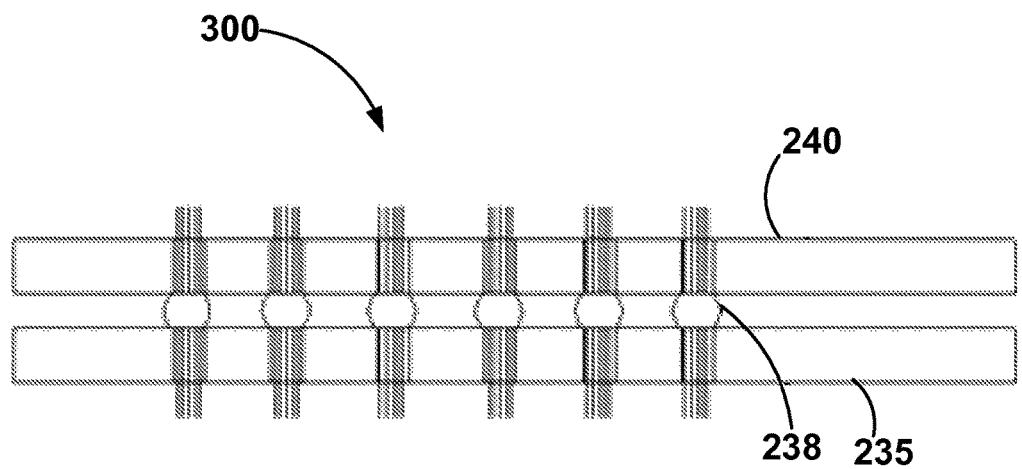
FIGS. 5A and 5B are side elevation views of an assembly including probe cards having nanotube probes according to some embodiments of the disclosed subject matter.
Figure 5B:
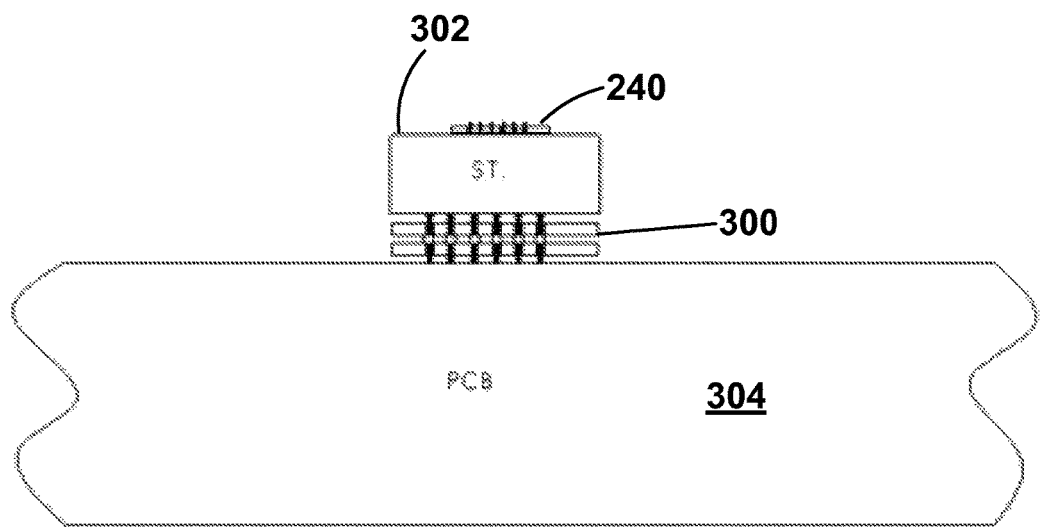

Referring now to FIGS. 5A and 5B, method 200 described above with respect to FIGS. 3, 4A, and 4B can include additional process steps to develop an assembly 300 that serves as an interface between a space transformer 302 and a printed circuit board 304 in order to make them easily separable for replacement. Assembly 300 generally can be developed by pairing assemblies 235 and 240 in FIGS. 4A and 4B with mirrored hole patterns aligned back-to-back.

Figure 6:
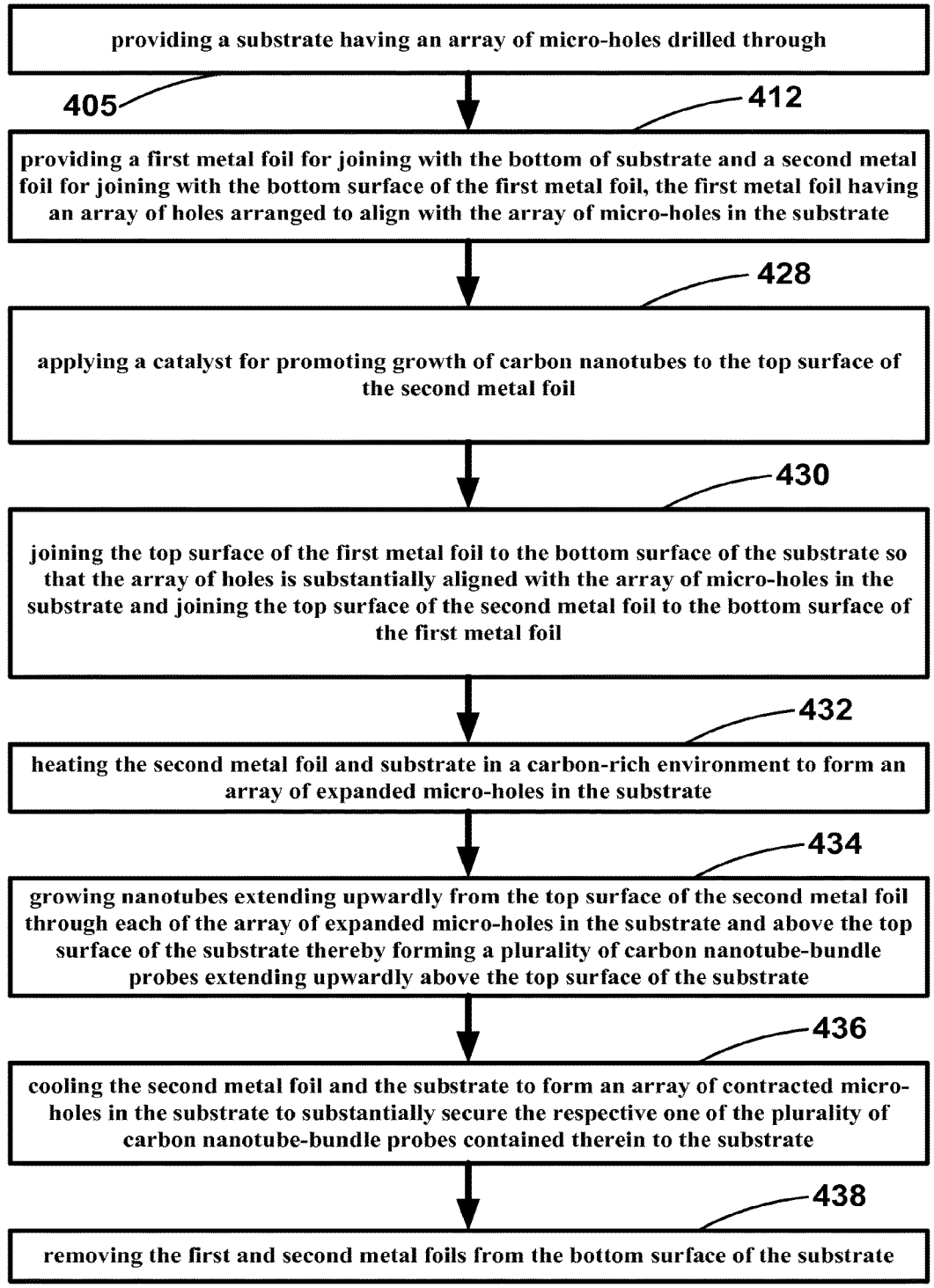
FIG. 6 is a diagram of a method of fabricating a probe card including nanotube probes according to some embodiments of the disclosed subject matter.
Figure 7A:
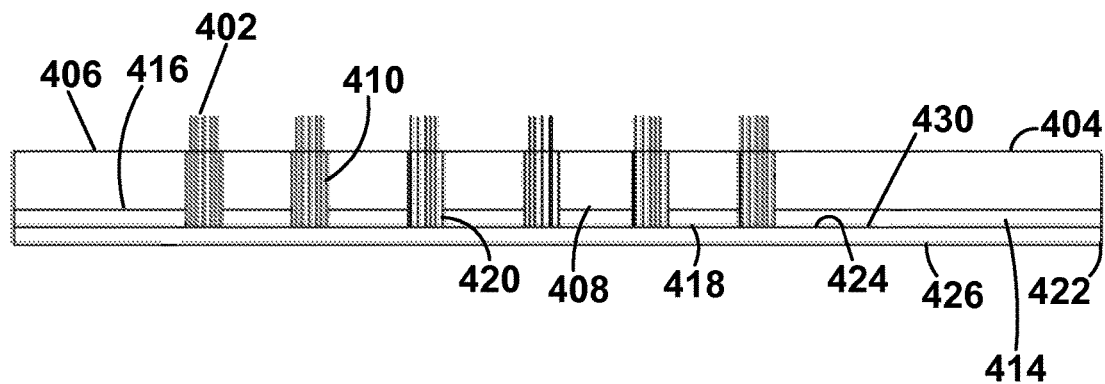
FIGS. 7A and 7B are side elevation views of a probe card including nanotube probes according to some embodiments of the disclosed subject matter.
Figure 7B:
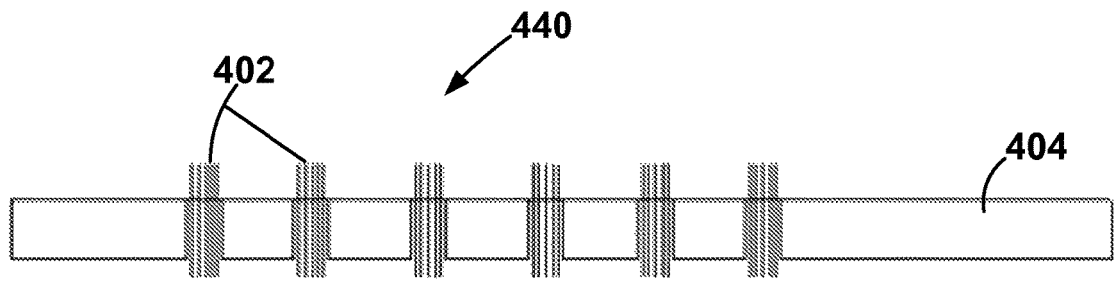

Referring now to FIGS. 6, 7A, and 7B, some embodiments include a method 400 of fabricating a plurality of carbon nanotube-bundle probes 402 extending from opposing surfaces of a substrate 404. At 405, method 200 first includes providing substrate 404 having a top surface 406, a bottom surface 408, and an array of micro-holes 410 drilled through and connecting the top and bottom surfaces.

At 412, a first metal foil 414 having top and bottom surfaces 416 and 418, respectively, and an array of holes 420 drilled through and connecting the top and bottom surfaces is provided. Array of holes 420 is arranged to align with array of micro-holes 410 in substrate 404. Still at 412, a second metal foil 422 having top and bottom surfaces 424 and 426, respectively, is provided. Second metal foil 422 is configured for joining with bottom surface 418 of first metal foil 414.

At 428, a catalyst 430 for promoting growth of carbon nanotubes is applied to top surface 424 of second metal foil 422. At 430, top surface 416 of first metal foil 414 is joined to bottom surface 408 of substrate 204 so that array of holes 420 is substantially aligned with array of micro-holes 410 in the substrate and top surface 424 of second metal foil 422 is joined to bottom surface 418 of the first metal foil.

At 432, second metal foil 422 and substrate 404 are heated in a carbon-rich environment thereby causing each of micro-holes 410 in the substrate to expand thereby forming an array of expanded micro-holes 410 in the substrate. At 434, nanotubes are grown so as to extend upwardly from top surface 424 of second metal foil 422 through each of array of holes 420 in first metal foil 414 and array of expanded micro-holes 410 in substrate 404 and above top surface 406 of the substrate thereby forming plurality of carbon nanotube-bundle probes 402 extending upwardly above the top surface of the substrate. Each of plurality of carbon nanotube-bundle probes 402 substantially fills a respective one of array of expanded micro-holes 410.

At 436, second metal foil 422 and substrate 404 are cooled thereby causing each of array of expanded micro-holes 410 in the substrate to contract thereby forming an array of contracted micro-holes 410 in the substrate. Each one of array of contracted micro-holes 410 provides a shrink fit around a respective one of plurality of carbon nanotube-bundle probes 402 contained therein so as to substantially secure the respective one of the plurality of carbon nanotube-bundle probes contained therein to the substrate. Referring to FIG. 7B, at 438, first and second metal foils 414 and 422, respectively, are removed from bottom surface 408 of substrate 404 to form an assembly 440.

Figure 8A:
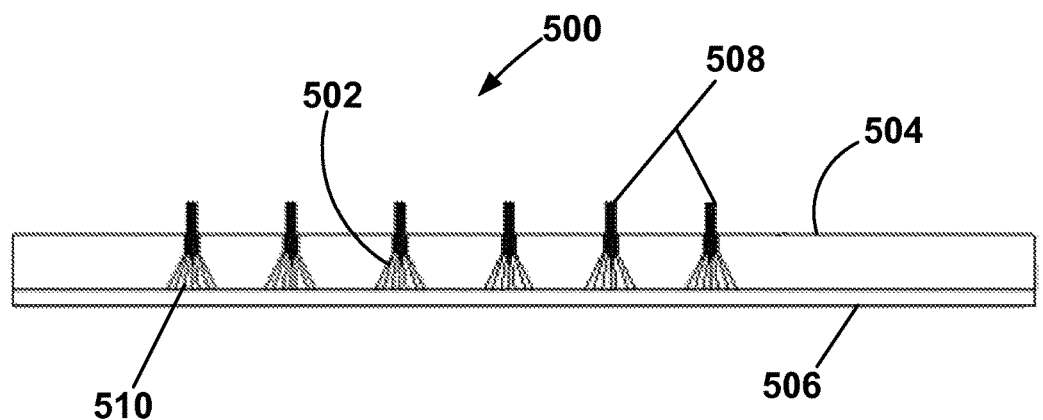
FIGS. 8A and 8B are side elevation views of a probe card including nanotube probes according to some embodiments of the disclosed subject matter.
Figure 8B:
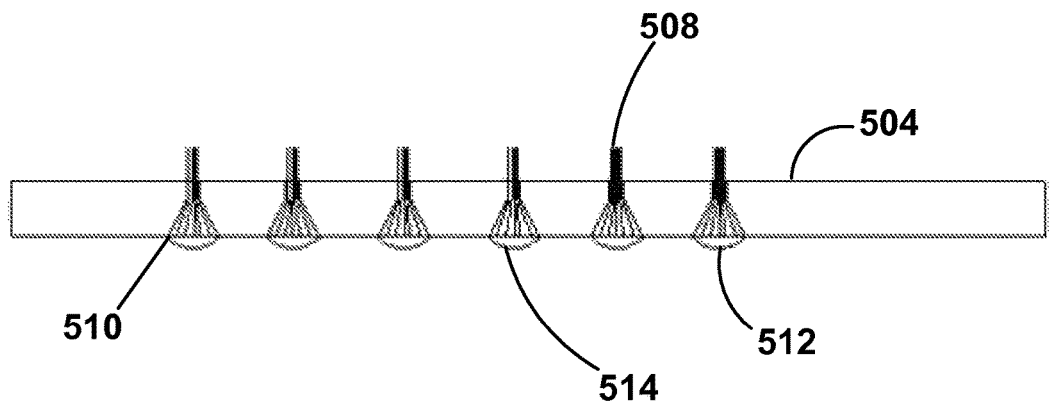

Variations on embodiments of the disclosed subject matter are possible. For example, referring now to FIGS. 8A and 8B, some embodiments are directed to methods that include forming an assembly 500, which includes a tapered micro-hole 502 in a substrate 504 having a foil 506 backing so as to induce a tighter packing density in a nanotube bundle 508 as it grows up through the micro-hole, and therefore a tighter "shrink" fit as well as modification of the "stiffness" of the compliant nanotube bundle. As shown in FIG. 8B, a back side 510 of tapered micro-hole 502 is typically filled with a solder or conductive epoxy 512 after nanotube growth to form attachment bumps 514 and form a "plug" to secure nanotube bundle 508 to substrate 504.

Figure 9:
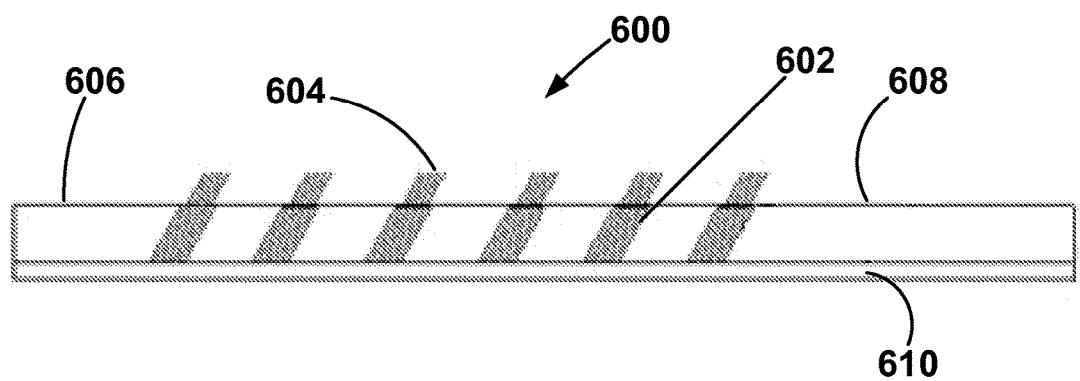
FIG. 9 is a side elevation views of a probe card including nanotube probes according to some embodiments of the disclosed subject matter.

Referring now to FIG. 9, some embodiments are directed to methods to form an assembly 600 that include drilling slanted micro-holes 602 to induce nanotube bundles 604 to emerge at an angle to a top surface 606 of a substrate 608 having a foil 610 backing, in order to obtain a different force-deflection characteristic for the probe and/or a different scrubbing action.

Each of the embodiments described in FIG. 3-9 can employ known methods to assist with transferring the nanotube/substrate assembly. One known method includes pouring a poly(dimethylsiloxane) (PDMS) liquid over the nanotubes and curing it until it forms a polymer. In this case, the polymer is used to help adhere the nanotube bundle to the substrate. The foil is then peeled off the polymer, substrate and nanotubes assembly and the assembly transferred to a space transformer. Incorporating the rigid substrate in the assembly facilitates handling and alignment of the substrate assembly with the space transformer. It also provides rigidity and support when interfacing with flexible or fragile space transformers such a polymer films or silicon wafers.

Figure 10:
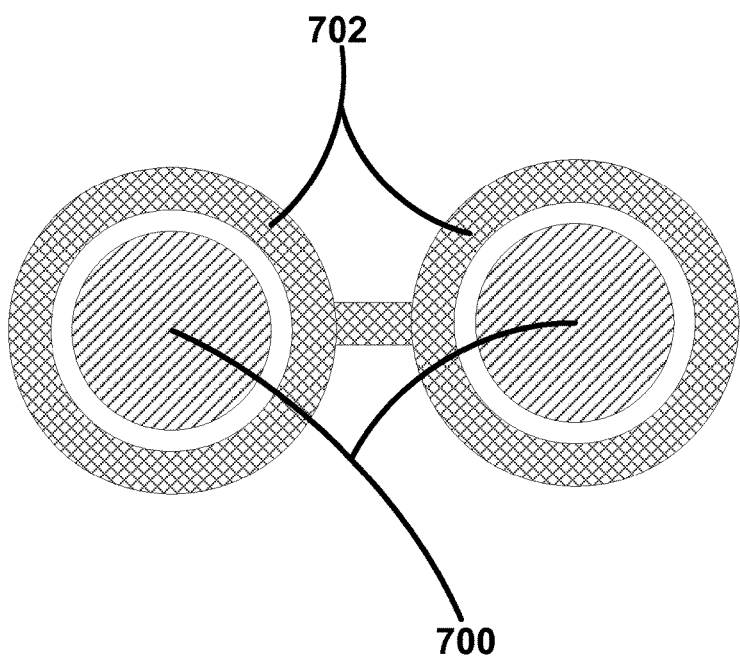
FIG. 10 is a top plan view of an array of nanotubes according to some embodiments of the disclosed subject matter.

Referring now to FIGS. 1, 2, and 10, in some embodiments, pads 112 on substrate 104 can be patterned so as to create a co-axial arrangement of nanotubes, with an inner ring 700 of nanotubes forming signal pads and an outer ring 702 of nanotubes routed to a ground plane, further limiting cross-talk between probes.

In some embodiments, the electron-emitting properties of nanotubes can be utilized to make a non-contacting probe in a vacuum environment. This property is currently being explored as a display technology. In certain test applications involving low current requirements, electrons are transferred through the small gap between the probe and the IC pad without actually making physical contact with the pad. This avoids the risk of damaging or contaminating the pad or probe through physical contact.

In some embodiments, telescoping probes are developed from multi-walled nanotubes by removing the cap on the outer tube to allow the inner tube to telescope outwards. It has been shown that applying a different charge to the inner and outer tubes can cause the inner tube to extend and bridge the gap between two contacts.

In some embodiments, the formation of so-called "colossal carbon nanotubes" is induced using a CVD process involving ethylene and paraffin oil.

The disclosed subject matter offers a plurality of benefits and advantages over prior art designs. Probe cards developed with nanotube probes allow for testing of ICs with tighter pitch, higher current capacity, improved planarity, elimination of mechanical assembly and handling operations, very low inductance, potential for full wafer probing at elevated temperatures, and easier cleaning of probes.

As mentioned above, in some embodiments, a probe card can be constructed by inducing the growth of nanotube arrays perpendicular to a substrate. The nanotube arrays act as electrical contacts or "probes" to bridge the space between the substrate and a device under test. By "growing" the contacts directly on a substrate, the contacts may be placed closer together than would be possible with conventional buckling beam technology. The unique physical characteristics of nanotubes (very high strength, very high current capacity, and elastic buckling) provide significant advantages over conventional technologies.

By "growing" the contacts directly on a substrate, the contacts may be placed closer together than would be possible with conventional probing technology, allowing for tight pitch probing. Since the individual nanotubes that make up the array are so tiny, there is no practical limit to the size of the substrate pad, as hundreds of thousands of nanotubes would fit on the pad. In addition, the "stiffness" of the probe array could be controlled by varying the diameter of the pad on which the array is grown. Since the probe is "grown" rather than assembled conventionally, the alignment is limited only by the placement tolerance of the photo-lithographically defined array of pads, which is very good and comparable to the location tolerance of the IC pads themselves. In contrast, conventional probing technology is an assembly of components, all having their own tolerances, and the tolerance accumulation limits the alignment accuracy capability of the probe.

Despite their small size, nanotubes can handle large amounts of current due to the "ballistic" nature of the electron flow. The individual nanotubes are largely defect-free, allowing for very low resistance to electron flow. As a result, the nanotube array can handle significantly larger currents than could be passed through a conventional probe made of bulk material, such as beryllium-copper, of the same total cross-sectional area. They are also compatible with elevated temperature testing.

Nanotubes also exhibit good mechanical characteristics. Due to the lack of defects, it has been demonstrated that individual nanotubes can be bent to extreme angles, yet return elastically to their original shape. Their tensile strengths are ten times greater than steel. Arrays of nanotubes have shown the capacity to be repeatedly compressed to 15% of their original length. These unique physical characteristics make them ideal probes and provide significant advantages over conventional technologies. Their high strength and elastic properties allow the nanotubes to be significantly shorter than is possible with conventional probes, while still providing sufficient compliance to allow for the pad height variation of the IC's under test. Typically, at least 3 mils of compliance would be necessary due to pad height and wafer thickness variations. The nanotube probes can be grown as short as 4 mils, allowing for very low electrical inductance suitable for ultra-high frequency testing.

Cleaning of the nanotube bundle probe can be accomplished by taking advantage of the relative surface roughness of the bundle tip. As there are no dangling covalent bonds on the nanotube, the nanotube probe is chemically non-reactive so non-conductive oxides do not tend to form on the probe tips. The lower surface area in contact with the contaminant tends to reduce the van der Waals attraction between a nanotube probe and contaminants. Bringing a nanotube probe array in contact with a smooth surface, such as quartz, ruthenium, tantalum oxynitride, etc., tends to transfer contaminants from the nanotube probe onto the smoother surface due to its greater van der Waals attractive force.

Although the disclosed subject matter has been described and illustrated with respect to embodiments thereof, it should be understood by those skilled in the art that features of the disclosed embodiments can be combined, rearranged, etc., to produce additional embodiments within the scope of the invention, and that various other changes, omissions, and additions may be made therein and thereto, without parting from the spirit and scope of the present application.

What is claimed is:

1. A method of fabricating a plurality of carbon nanotube-bundle probes on a substrate, said method comprising:
   providing the substrate having a top surface and a bottom surface;
   forming an array of electrically conductive pads on said top surface, each of said pads including first and second concentric conductive areas electrically isolated from each other by a non-conductive portion of the top surface, said first conductive area being an outer ground ring and said second conductive area being an inner signal pad that is a substantially solid circle;
   applying a catalyst for promoting growth of carbon nanotubes on each of said first and second concentric rings of each pad of said array of electrically conductive pads; and
   heating said substrate in a carbon-rich environment thereby growing nanotubes extending upwardly from each of said first and second concentric rings of each pad of said array of electrically conductive pads thereby forming an array of concentric nanotubes extending upwardly from said first and second concentric rings of each pad, wherein a common bus electrically connects the outer ground ring members of the array.

2. A method according to claim 1, wherein said array of electrically conductive pads are formed to mirror an array of pads on an integrated circuit that is to be tested.

3. A method according to claim 1, wherein said carbon nanotubes are grown above said top surface of said substrate thereby farthing a plurality of carbon nanotube-bundle probes extending upwardly above said top surface of said substrate.

4. A method according to claim 1, further comprising capping each of said plurality of carbon nanotube-bundle probes with an electrically conductive material.

* * * * *